(12) United States Patent
Davis et al.

(10) Patent No.: US 10,470,321 B1
(45) Date of Patent: Nov. 5, 2019

(54) REINFORCED EMISSIVE DISPLAY ASSEMBLY

(71) Applicant: Rockwell Collins, Inc., Cedar Rapids, IA (US)

(72) Inventors: Joshua V. Davis, Cedar Rapids, IA (US); Steven W. Kramer, Toddville, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 112 days.

(21) Appl. No.: 15/853,122

(22) Filed: Dec. 22, 2017

(51) Int. Cl.
| | |
|---|---|
| H05K 5/00 | (2006.01) |
| H05K 5/02 | (2006.01) |
| H05K 5/03 | (2006.01) |
| H05K 7/20 | (2006.01) |
| B64D 43/00 | (2006.01) |
| H01L 33/64 | (2010.01) |
| H01L 51/52 | (2006.01) |
| H01L 33/48 | (2010.01) |

(52) U.S. Cl.
CPC ........... *H05K 5/0056* (2013.01); *B64D 43/00* (2013.01); *H05K 5/0004* (2013.01); *H05K 5/0017* (2013.01); *H05K 5/0217* (2013.01); *H05K 5/0247* (2013.01); *H05K 5/03* (2013.01); *H05K 7/20409* (2013.01); *H05K 7/20963* (2013.01); *H01L 33/483* (2013.01); *H01L 33/644* (2013.01); *H01L 51/529* (2013.01); *H01L 51/5237* (2013.01)

(58) Field of Classification Search
CPC ...... B64D 43/00; H05K 5/0056; H05K 5/006; H05K 5/0004; H05K 5/0017; H05K 5/0217; H05K 5/0247; H05K 5/03; H05K 7/20409; H05K 7/20418; H05K 7/20963; H01L 33/483; H01L 33/644; H01L 51/5237; H01L 51/529
USPC ........................................................ 361/707
See application file for complete search history.

(56) References Cited

U.S. PATENT DOCUMENTS

| | | | | |
|---|---|---|---|---|
| 7,408,777 | B2 * | 8/2008 | Jeong | H05K 7/20963 165/104.33 |
| 7,649,737 | B2 * | 1/2010 | Matsuzawa | G06F 1/20 174/252 |
| 2005/0117293 | A1 * | 6/2005 | Yokoyama | H01L 51/529 361/688 |
| 2006/0077619 | A1 * | 4/2006 | Kim | H05K 1/0204 361/679.21 |

(Continued)

*Primary Examiner* — Jacob R Crum
(74) *Attorney, Agent, or Firm* — Suiter Swantz pc llo

(57) ABSTRACT

An emissive display assembly including an emissive display, a circuit board associated with the emissive display element, a display chassis, and a support plate. The display chassis may house the emissive display element. The display chassis may further house the circuit board. The display chassis may have an aperture such that a front side of the emissive display element is viewable through the aperture. The support plate may be held in place by the display chassis and positioned between the emissive display element and the circuit board. The support plate may support a back side of the emissive display element such that, when a compressive force is applied to the front side of the emissive display element, the support plate restricts the emissive display element from bending more than a predetermined bending threshold.

17 Claims, 6 Drawing Sheets

(56) References Cited

U.S. PATENT DOCUMENTS

| | | | |
|---|---|---|---|
| 2009/0059502 A1* | 3/2009 | Filson | G06F 1/1601 |
| | | | 361/679.27 |
| 2009/0168357 A1* | 7/2009 | Suzuki | H05K 5/02 |
| | | | 361/709 |
| 2009/0225507 A1* | 9/2009 | Sato | H05K 7/20963 |
| | | | 361/679.21 |
| 2009/0316372 A1* | 12/2009 | Kozlovski | H05K 5/006 |
| | | | 361/757 |
| 2012/0105253 A1* | 5/2012 | Lillis | H05B 33/0818 |
| | | | 340/945 |
| 2014/0078696 A1* | 3/2014 | Matsuda | G06F 3/041 |
| | | | 361/752 |
| 2017/0171998 A1* | 6/2017 | Huang | H04N 5/64 |

* cited by examiner

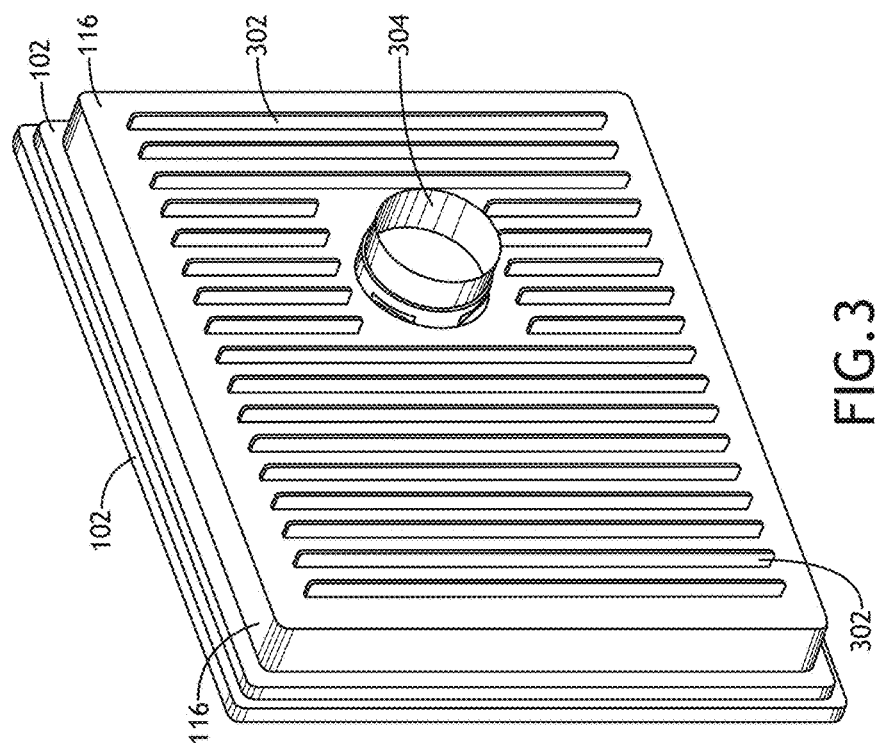
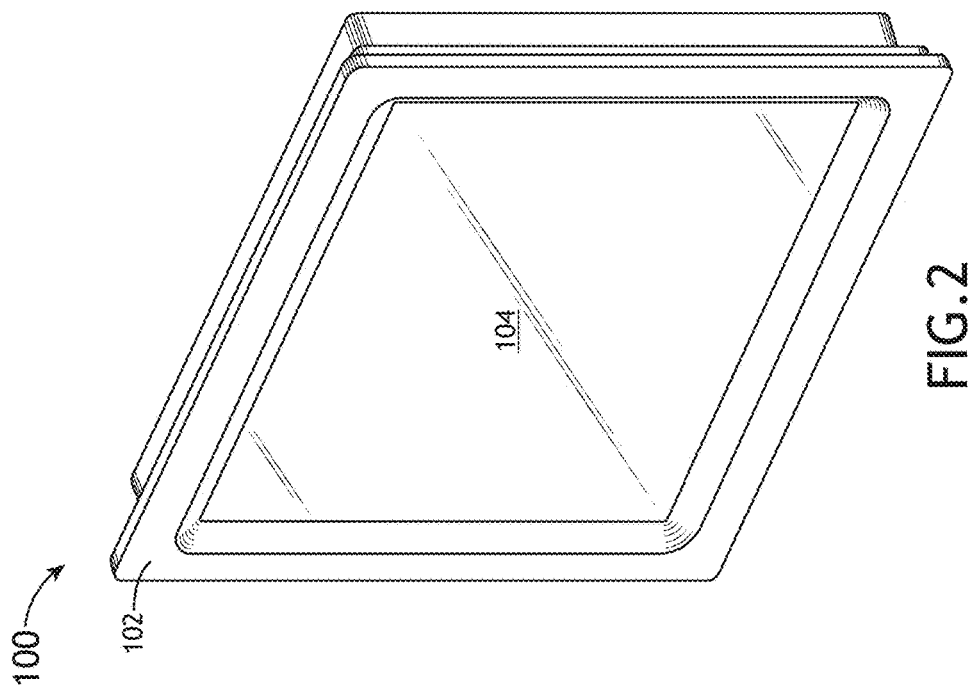

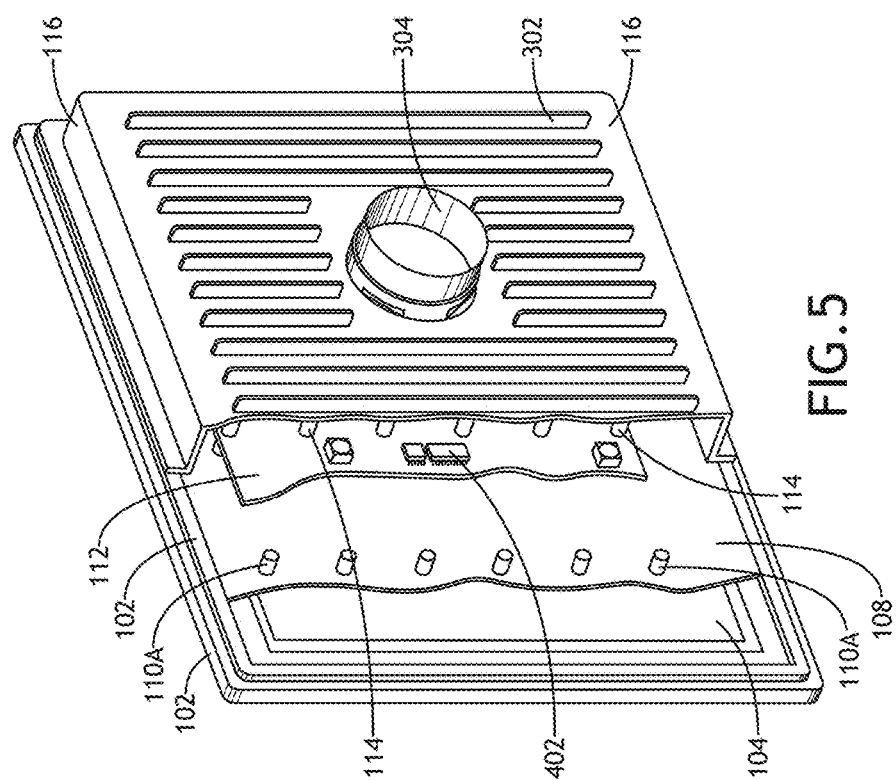
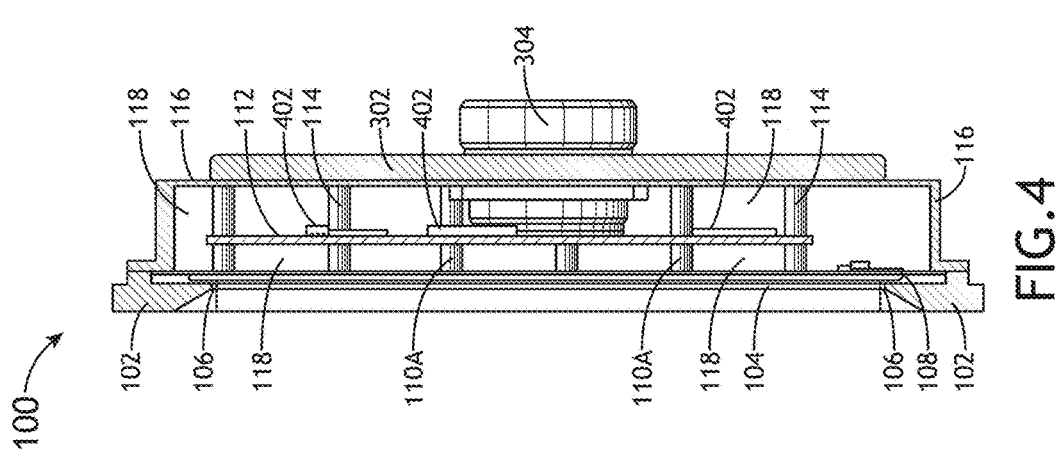

REINFORCED EMISSIVE DISPLAY ASSEMBLY

BACKGROUND

Displays used in airborne applications and other harsh environments must be sufficiently ruggedized so as to allow for component survival in vibration and shock events. Additionally, displays used in aircraft must provide sufficient stiffness to reinforce a touchscreen interface or survive an inadvertent palm bracing by a user during a turbulence event. Traditional means of stiffening an optical display stack add unwanted weight and cost. Adding to such challenges, displays produce a significant amount of heat that needs to be dissipated for proper functioning of the display.

Over the last few decades, almost all harsh environment display applications have utilized liquid crystal display (LCD) technology. LCD technology uses a switchable matrix with liquid crystal interaction to regulate light through a transmissive color filter. LCD technology must be illuminated by a separate light source from behind (e.g., from a backlight) in order to present readable information to the user. LCD technology requires heavy and costly, optically indexed and transmissive (clear) adhesive and/or glass components to be used to stiffen the optical stack in addressing the environmental hardening needs for harsh environment applications. Typically, such structural enhancements must be free spanning, which further compounds the weight increase. Such a technique, though necessary for backlit display technologies, proves inefficient by offering diminishing returns because substantial weight must be added for little stiffness improvement. Typically, monolithic glass substrates are the only economical option for LCD display technology utilized in harsh environments. Additionally, the stiffening components, which are typically adhered to the LCD display, result in low yield issues caused by visible contaminants due to the transmissive nature of the LCD technology and requisite backlit illumination. Such LCD technology yield issues result in increased cost.

SUMMARY

In one aspect, embodiments of the inventive concepts disclosed herein are directed to an emissive display assembly. The emissive display assembly may include an emissive display element, a circuit board, a display chassis, and a support plate. The emissive display element may have a back side and a front side. The circuit board may be associated with the emissive display element. The display chassis may house the emissive display element. The display chassis may further house the circuit board. The display chassis may have an aperture such that the front side of the emissive display element is viewable through the aperture. The support plate may be held in place by the display chassis and positioned between the emissive display element and the circuit board. The support plate may support the back side of the emissive display element such that, when a compressive force is applied to the front side of the emissive display element, the support plate restricts the emissive display element from bending more than a predetermined bending threshold.

In a further aspect, embodiments of the inventive concepts disclosed herein are directed to a system. The system may include a vehicle and an emissive display assembly implemented in the vehicle. The emissive display assembly may include an emissive display element, a circuit board, a display chassis, and a support plate. The emissive display element may have a back side and a front side. The circuit board may be associated with the emissive display element. The display chassis may house the emissive display element. The display chassis may further house the circuit board. The display chassis may have an aperture such that the front side of the emissive display element is viewable through the aperture. The support plate may be held in place by the display chassis and positioned between the emissive display element and the circuit board. The support plate may support the back side of the emissive display element such that, when a compressive force is applied to the front side of the emissive display element, the support plate restricts the emissive display element from bending more than a predetermined bending threshold.

In a further aspect, embodiments of the inventive concepts disclosed herein are directed to an aircraft system. The system may include a flight deck panel implemented in a cockpit of an aircraft and an emissive display assembly implemented in the flight deck panel. The emissive display assembly may include an emissive display element, a circuit board, a display chassis, and a support plate. The emissive display element may have a back side and a front side. The circuit board may be associated with the emissive display element. The display chassis may house the emissive display element. The display chassis may further house the circuit board. The display chassis may have an aperture such that the front side of the emissive display element is viewable through the aperture. The support plate may be held in place by the display chassis and positioned between the emissive display element and the circuit board. The support plate may support the back side of the emissive display element such that, when a compressive force is applied to the front side of the emissive display element, the support plate restricts the emissive display element from bending more than a predetermined bending threshold.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings:

FIG. 2 is a front, isometric view of an exemplary embodiment of the emissive display assembly according to the inventive concepts disclosed herein.

FIG. 3 is a rear isometric view of the emissive display assembly of FIG. 2.

FIG. 4 is a side cross-sectional view of the emissive display assembly of FIG. 2.

FIG. 5 is a rear, partial see-through view of the emissive display assembly 100 of FIG. 2.

DETAILED DESCRIPTION

Figure 1:
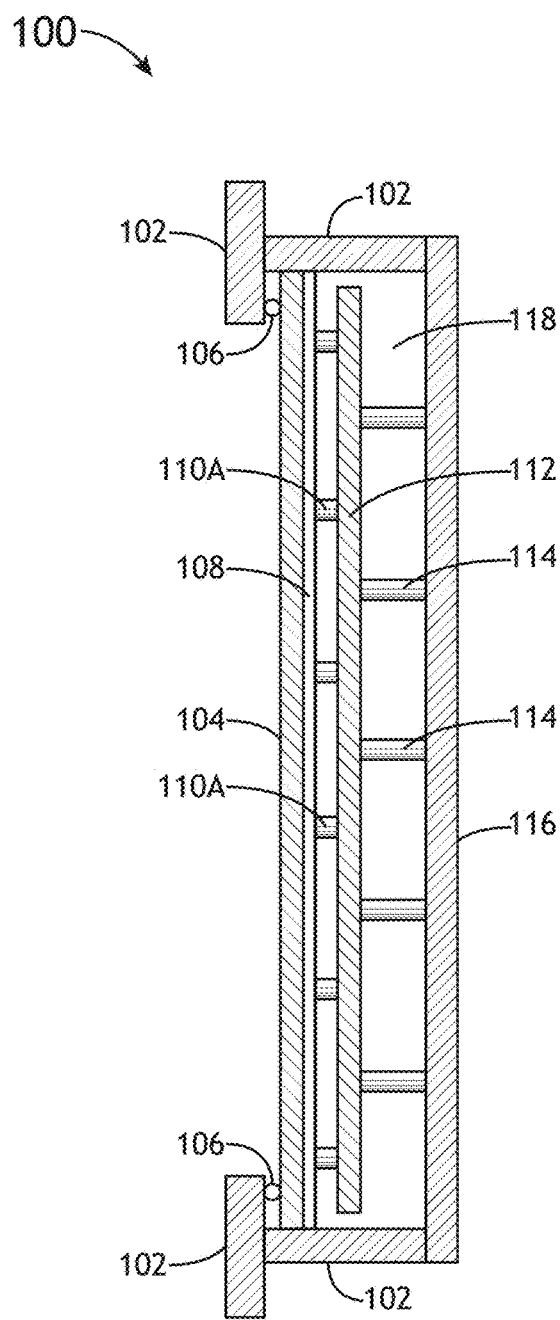
FIG. 1 is a cross-sectional view of an exemplary embodiment of a reinforced emissive display assembly according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a reinforced emissive display assembly. The emissive display assembly may include an emissive display element (e.g., an organic light-emitting diode (OLED) display element, a micro light-emitting diode (mLED) display element, or a quantum-dot light emitting-diode (QLED) display element) configured to emit light having any suitable colors. Emissive display elements are different than transmissive display elements (e.g., LCD display elements) because emissive display elements emit light with any suitable color(s) whereas transmissive display elements merely include a transmissive color filter configured to impart color(s) from light emitted from a backlight or edge-light. Emissive display elements may be manufactured to a very thin form factor on glass or other materials, as compared to LCD display elements which are typically thicker. Embodiments of an emissive display assembly for use in a harsh environment have low (e.g., minimal) weight and thickness while providing at least sufficient stiffness for the harsh environment at least partially due to such emissive display assembly not requiring a thick transparent support glass substrate (which are required for reinforced LCD display assemblies).

Reinforced emissive display assemblies having emissive display elements may be used in harsh environments, such as vehicles (e.g., aircraft or automobiles) or in industrial applications, where significant vibrations, shock, and/or impact forces (e.g., compressive impact forces) may occur. Advantageously, reinforced emissive display assemblies of the inventive concepts disclosed do not necessarily require a heavy transparent substrate to provide stiffening suitable for use in such harsh environments. Additionally, embodiments of the reinforced emissive display assemblies may have reduced weight, reduced thickness, reduced implementation complexity, reduced cost, and improved manufacturability as compared to reinforced transmissive display assemblies (e.g., LCD display assemblies) which require a backlight and a thick support glass substrate.

Some embodiments may include augmenting the stiffness and structural integrity of the emissive display element, such as by providing (e.g., by laminating to) a support plate to a backside of the emissive display element. Such a support plate may be comprised of a high Young's modulus material(s) (e.g., steel, steel alloy, aluminum, aluminum alloy, titanium, titanium alloy, magnesium, magnesium alloy, carbon fiber, and/or carbon fiber composite), such that support plate prevents the emissive display element from bending more than an acceptable threshold amount when a compressive force is applied to a front side of the display element. Additionally, such a support plate may have a structural geometry and/or support structures configured to improve (e.g., maximize) stiffness while reducing (e.g., minimizing) weight. Additionally, in some embodiments, the support plate and/or associated support structures may be implemented as a heat sink(s) configured to cool the emissive display element.

Some embodiments implemented with a support plate may be configured to stiffen the emissive display element while reducing the weight of the emissive display assembly, such as by 60-70% as compared to a reinforced LCD display assembly. Some embodiments using a thinner support plate with an array of support posts may reduce a weight of the emissive display assembly, such as by 75-85% as compared to a reinforced LCD display assembly. Such weight reductions would be advantageous for many applications of a reinforced display assembly, such as in an aircraft where added weight adds to fuel costs and diminishes performance of the aircraft.

Referring now to FIG. 1, a cross-sectional view of an exemplary embodiment of a reinforced emissive display assembly 100 according to the inventive concepts disclosed herein is depicted. The emissive display assembly 100 may include a display chassis 102, an emissive display element 104, at least one seal 106, a support plate 108, at least one support structure (e.g., support posts 110A), at least one circuit board 112, at least one additional support structure (e.g., additional support posts 114), a rear cover 116, and at least one cavity 118.

The display chassis 102 may be configured to house and surround edges of the emissive display element 104. Additionally, the display chassis 102 may house the circuit board 112 and the support plate 108, as well as other components of the emissive display assembly 100. The display chassis 102 may have an aperture such that a front side of the emissive display element 104 is viewable by a user through the aperture. The display chassis 102 may be implemented as a rigid housing configured to contain various components of the emissive display assembly 100. In some embodiments, the display chassis 102 forms a rigid frame around various components of the emissive display assembly 100. Additionally, the display chassis 102 may include a bezel around the edges of the emissive display element 104. The display chassis 102 may be composed of any suitable material(s), such as steel, steel alloy, aluminum, aluminum alloy, titanium, titanium alloy, magnesium, magnesium alloy, other metal alloys, plastic, carbon fiber, and/or carbon fiber composite.

Figure 6:
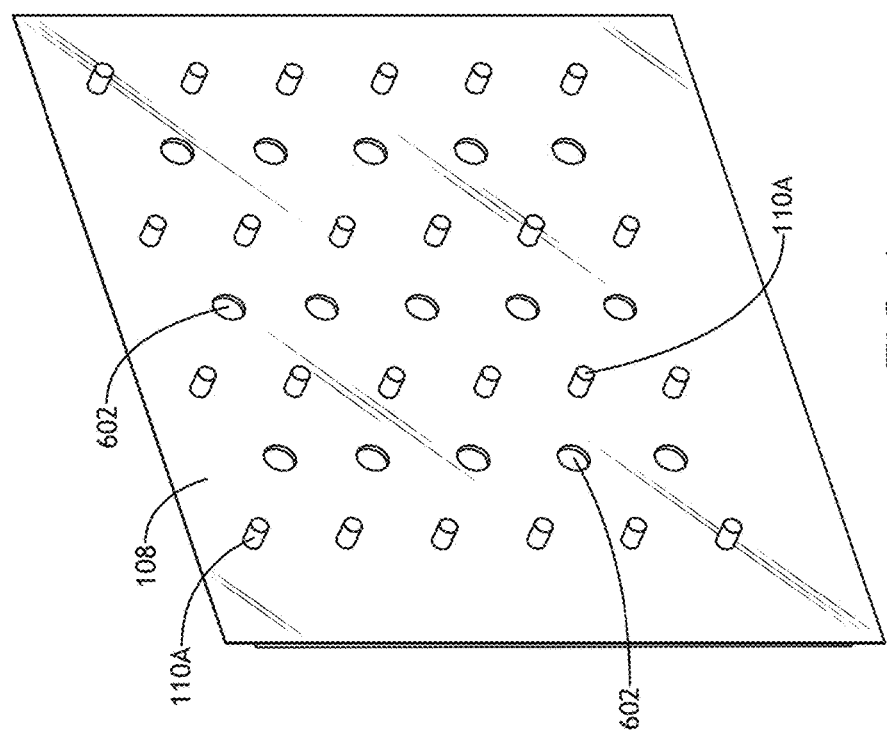
FIG. 6 is a rear, isometric view of a support plate and support posts of an exemplary embodiment according to the inventive concepts disclosed herein.

The support plate 108 may be mechanically coupled to (e.g., formed from a common piece of material as, screwed to, nailed to, riveted to, bolted to, glued to, welded to, fused to, and/or attached to) the display chassis 102 such that the display chassis 102 holds the support plate 108 in place. The support plate 108 may span an interior portion of the display chassis 102. The support plate 108 may be positioned in a plane parallel to the aperture of the display chassis 102 (whereby the front side of the emissive display element 104 is viewable by a user through the aperture). In some embodiments, the back side of the emissive display element 104 may be mechanically coupled to (e.g., screwed to, riveted to, bolted to, glued to, welded to, fused to, and/or attached to) the support plate 108. The support plate 108 may be configured to support the back side of the emissive display element 104 such that, when a compressive force is applied to the front side of the emissive display element 104, the support plate 108 restricts the emissive display element 104 from bending more than a predetermined bending threshold (e.g., a predetermined amount of bending which is less than an amount of bending expected to cause the emissive display element 104 to fracture, crack, or otherwise damage the emissive display element 104). Such predetermined bending threshold would be readily ascertainable to those of skill in the art based on a material(s) selected for use in the emissive display element 104. In some embodiments, the support plate may include one or more holes (e.g., holes 602, as shown in FIG. 6) or counterbores, for example, to reduce weight. The support plate 108 may be composed of a high Young's modulus material(s) (e.g., steel, steel alloy, aluminum, aluminum alloy, titanium, titanium alloy, magnesium, magnesium alloy, carbon fiber, and/or carbon fiber composite), such that support plate 108 prevents the emissive display element 104 from bending more than an acceptable threshold amount when a compressive force is applied to the front side of the emissive display element 104. The support plate 108 may be opaque.

In some embodiments, the support plate 108 may be at least partially composed of a thermally conductive material (e.g., aluminum, aluminum alloy, magnesium, magnesium alloy, graphene, pyrolytic graphene, copper, other metal alloys, and/or metal-doped plastic) such that the support plate 108 may be implemented as a heat sink configured to dissipate heat generated by the emissive display element 104. The thermally conductive material may conduct heat away from the emissive display element 104, for example, to other components of the emissive display assembly 100. Additionally, convective heat transfer may occur from the thermally conductive material and/or other components into air within and/or around the emissive display assembly 100.

The back side of the emissive display element 104 may be mechanically coupled to the support plate 108. The front side of the emissive display element 104 may be viewable by a user through the aperture of the display chassis 102. The emissive display element 104 may be implemented as any suitable emissive display element, such as an OLED display element, an mLED display element, or a QLED display element, configured to emit light having any suitable colors. The emissive display element 104 may be manufactured to a thin form factor on glass or other materials. The emissive display element 104 may be communicatively coupled to the circuit board 112. The emissive display element 104 may be configured to present images to a user. In some embodiments, a touch-screen display substrate may be adhered to and/or included with the emissive display element 104 such that the emissive display element 104 is implemented as a touch-screen emissive display element. Operation of the emissive display element 104 produces heat. In some embodiments, the support plate 108 may be configured to dissipate heat produced by the emissive display element 104.

The seal 106 may be installed along the edges of the emissive display element 104 between the display chassis 102 and the emissive display element 104. The seal 106 may be configured to prevent dust, moisture, and/or air from entering the emissive display assembly 100. In some embodiments, the seal 106 may be implemented as a gasket.

Figure 7:
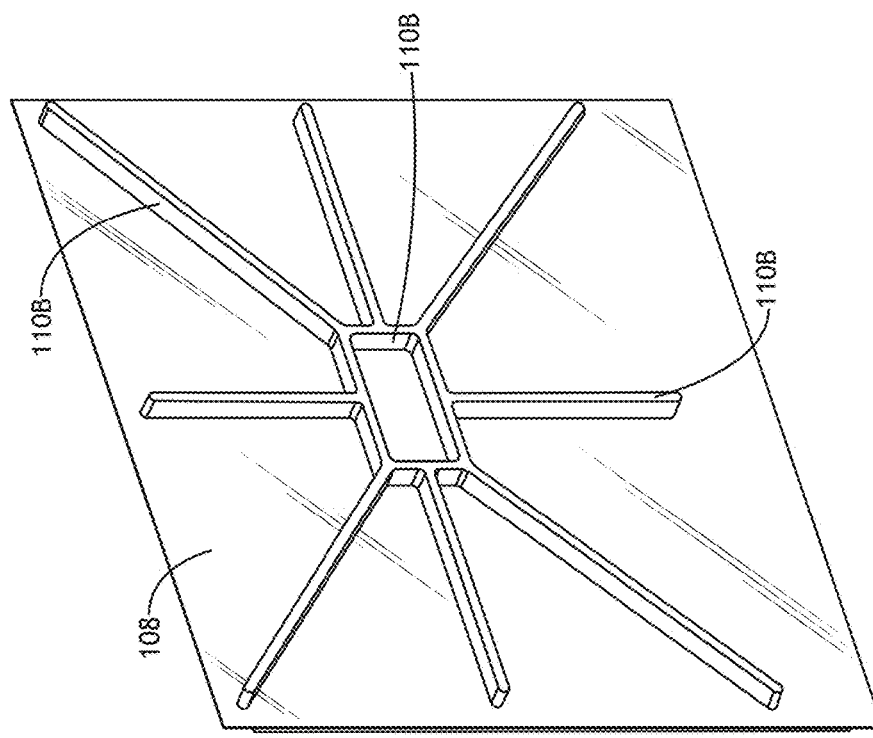
FIG. 7 is a rear, isometric view of a support plate and a support structure of an exemplary embodiment according to the inventive concepts disclosed herein.
Figure 8:
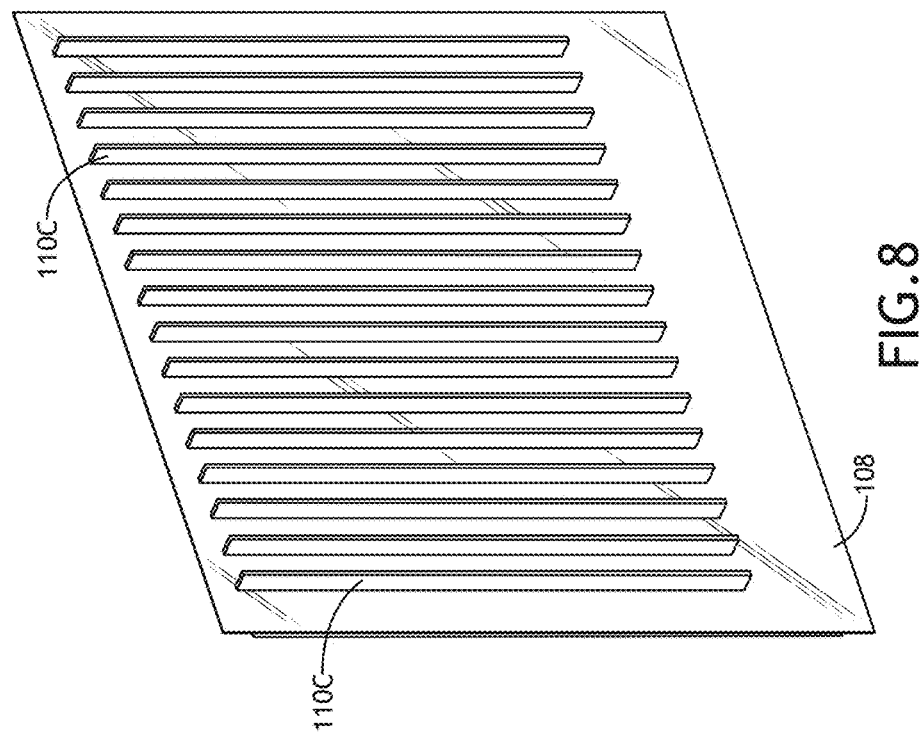
FIG. 8 is a rear, isometric view of a support plate and support ridges of an exemplary embodiment according to the inventive concepts disclosed herein.

At least one support structure (e.g., support posts 110A, as shown in FIGS. 1, 4-6, and 9; support structure 1106, as shown in FIG. 7; and/or support ridges 110C, as shown in FIG. 8) may be positioned between the support plate 108 and the circuit board 112 and within at least one cavity 118 formed between the support plate 108 and the rear cover 116 and between opposite sides (e.g., between the top and bottom and between the left and right sides) of the display chassis 102. When a compressive force is applied to the front side of the emissive display element 104, the at least one support structure may be configured to reinforce the support plate 108 such that at least part of the compressive force is transferred to the at least one support structure. As such, the at least one support structure may be configured to reinforce the support plate 108 and restrict bending of the emissive display element 104. For example, the compressive force may be transferred to the support posts 110A, and such transferred force may be further transferred to the circuit board 112, the additional support posts 114, and/or the rear cover 116.

In some embodiments, the at least one support structure abuts (e.g., with or without mechanical coupling) the support plate 108 and is mechanically coupled to (e.g., screwed to, nailed to, riveted to, bolted to, glued to, welded to, fused to, and/or attached to) the circuit board 112. In some embodiments, the at least one support structure is mechanically coupled to (e.g., formed from a common piece of material as, screwed to, nailed to, riveted to, bolted to, glued to, welded to, fused to, and/or attached to) the support plate 108 and abuts the circuit board 112. In some embodiments, the at least one support structure is mechanically coupled to (e.g., formed from a common piece of material as, screwed to, nailed to, riveted to, bolted to, glued to, welded to, fused to, and/or attached to) the support plate 108 and is mechanically coupled to (e.g., screwed to, nailed to, riveted to, bolted to, glued to, welded to, fused to, and/or attached to) the circuit board 112.

In some embodiments, the at least one support structure may be composed of a high Young's modulus material(s) (e.g., steel, steel alloy, aluminum, aluminum alloy, titanium, titanium alloy, magnesium, magnesium alloy, carbon fiber, and/or carbon fiber composite), such that at least one support structure reinforces a stiffness of the support plate 108.

In some embodiments, the at least one support structure may be composed of a thermally conductive material (e.g., aluminum, aluminum alloy, magnesium, magnesium alloy, graphene, pyrolytic graphene, copper, other metal alloys, and/or metal-doped plastic) such that the at least one support structure may be implemented as a heat sink configured to dissipate heat generated by the emissive display element 104 and transferred through the support plate 108 to the at least one support structure. Additionally, the cavity 118 and the at least one support structure may form a convective heat sink field, whereby heat is transferred from the at least one support structure into air within the cavity 118 such that a convective air circulation results within the cavity 118. For example, the cavity 118 and the support posts 110A may form a convective pin heat sink field.

While the support posts 110A are exemplarily depicted as cylindrical support posts, in some embodiments, the support posts 110A may have any suitable cross-sectional shape (e.g., non-cylindrical, elliptical, triangular, rectangular, pentagonal, hexagonal, etc.).

The circuit board 112 may be positioned between the at least one support structure and the at least one additional support structure (e.g., additional support posts 114). The circuit board 112 may be implemented as a printed circuit board (PCB). The circuit board 112 may be associated with and communicatively coupled to the emissive display element 104 (as well as a touchscreen display substrate (if any)). Additionally, the circuit board 112 may be communicatively coupled to a data port (e.g., data port 304, as shown in FIGS. 3-5). The circuit board 112 may have a plurality of electrical pathways, and one or more electronic components (e.g., 402, as shown in FIGS. 4-5) may be mounted or installed on the circuit board 112. For example, the one or more electronic components may include at least one processor, at least one memory, and at least one storage device, as well as other electronic components commonly found in a display assembly, some or all of which may be communicatively coupled.

The at least one additional support structure (e.g., additional support posts 114) may be positioned between the rear cover 116 and the circuit board 112 and within at least one cavity 118 formed between the support plate 108 and the rear cover 116 and between opposite sides (e.g., between the top and bottom and between the left and right sides) of the display chassis 102. When a compressive force is applied to the front side of the emissive display element 104, the at least one additional support structure may be configured to reinforce the support plate 108 such that at least part of the compressive force is transferred to the at least one support structure and to the at least one additional support structure. As such, the at least one additional support structure may be configured to reinforce the support plate 108 and restrict bending of the emissive display element 104. For example, the compressive force may be transferred to the support posts 110A, and such transferred force may be further transferred to the circuit board 112, the additional support posts 114, and/or the rear cover 116.

In some embodiments, the at least one additional support structure abuts the rear cover 116 and is mechanically coupled to (e.g., screwed to, nailed to, riveted to, bolted to, glued to, welded to, fused to, and/or attached to) the circuit board 112. In some embodiments, the at least one additional support structure is mechanically coupled to (e.g., formed from a common piece of material as, screwed to, nailed to, riveted to, bolted to, glued to, welded to, fused to, and/or attached to) the rear cover 116 and abuts the circuit board 112. In some embodiments, the at least one additional support structure is mechanically coupled to (e.g., formed from a common piece of material as, screwed to, nailed to, riveted to, bolted to, glued to, welded to, fused to, and/or attached to) the rear cover 116 and is mechanically coupled to (e.g., screwed to, nailed to, riveted to, bolted to, glued to, welded to, fused to, and/or attached to) the circuit board 112.

In some embodiments, the at least one additional support structure may be composed of a high Young's modulus material(s) (e.g., steel, steel alloy, aluminum, aluminum alloy, titanium, titanium alloy, magnesium, magnesium alloy, carbon fiber, and/or carbon fiber composite), such that at least one additional support structure reinforces a stiffness of the support plate 108.

In some embodiments, the at least one additional support structure may be composed of a thermally conductive material (e.g., aluminum, aluminum alloy, magnesium, magnesium alloy, graphene, pyrolytic graphene, copper, other metal alloys, and/or metal-doped plastic) such that the at least one additional support structure may be implemented as a heat sink configured to dissipate heat generated by the emissive display element 104 and transferred through the support plate 108 and the at least one support structure to the at least one additional support structure. Additionally, the cavity 118, the at least one support structure, and the at least one additional support structure may form a convective heat sink field, whereby heat is transferred from the at least one support structure and the at least one additional support structure into air within the cavity 118 such that a convective air circulation results within the cavity 118. For example, the cavity 118, the support posts 110A, and the additional support posts 114 may form a convective pin heat sink field.

In some embodiments, the at least one additional support structure (e.g., additional support posts 114) may be aligned (e.g., as shown in FIG. 4) with the at least one support structure (e.g., support posts 110A). In some embodiments, though, some or all of the at least one additional support structure (e.g., additional support posts 114) may be unaligned (e.g., as shown in FIG. 1) with the at least one support structure (e.g., support posts 110A).

While the additional support posts 114 are exemplarily depicted as cylindrical additional support posts, in some embodiments, the additional support posts 114 may have any suitable cross-sectional shape (e.g., non-cylindrical, elliptical, triangular, rectangular, pentagonal, hexagonal, etc.).

The rear cover 116 may be configured to close off and/or form a back side of the emissive display assembly 100. The rear cover 116 may be mechanically coupled to (e.g., screwed to, nailed to, riveted to, bolted to, glued to, welded to, fused to, and/or attached to) the display chassis 102. The rear cover 116 may abut or be mechanically coupled to the at least one additional support structure (e.g., additional support posts 114).

In some embodiments, the rear cover 116 may be composed of a high Young's modulus material(s) (e.g., steel, steel alloy, aluminum, aluminum alloy, titanium, titanium alloy, magnesium, magnesium alloy, carbon fiber, and/or carbon fiber composite), such that the rear cover 116 reinforces a stiffness of the support plate 108.

In some embodiments, the rear cover 116 may be composed of a thermally conductive material (e.g., aluminum, aluminum alloy, magnesium, magnesium alloy, graphene, pyrolytic graphene, copper, other metal alloys, and/or metal-doped plastic) such that the rear cover 116 may be implemented as a heat sink configured to dissipate heat generated by the emissive display element 104 and transferred through the support plate 108, the at least one support structure, and the at least one additional support structure to the rear cover 116. Additionally, heat from the air within the cavity 118 may transfer heat to the rear cover 116 such that the rear cover 116 may transfer (e.g., at least in part via heat sink fins 302 on an external side of the rear cover 116, as shown in FIGS. 3-5) heat to air external to the emissive display assembly 100.

Referring now to FIG. 2, a front isometric view of an exemplary embodiment of the emissive display assembly 100 according to the inventive concepts disclosed herein is depicted. The emissive display assembly 100 of FIG. 2 may be implemented with components similar to and function similarly to the emissive display assembly 100 shown in and described with respect to FIG. 1. As shown in FIG. 2, the front side of the emissive display element 104 is viewable through the aperture of the display chassis 102.

Referring now to FIG. 3, a rear isometric view of the emissive display assembly 100 of FIG. 2 is depicted. As shown in FIG. 2, the rear cover 116 may include a port (e.g., a data port 304 and/or a power port) and heat sink fins 302 extending from an external side of the rear cover 116.

The heat sink fins 302 may be mechanically coupled to (e.g., formed from a common piece of material as, screwed to, nailed to, riveted to, bolted to, glued to, welded to, fused to, and/or attached to) the rear cover 116. The heat sink fins 302 may be composed of a thermally conductive material (e.g., aluminum, aluminum alloy, magnesium, magnesium alloy, graphene, pyrolytic graphene, copper, other metal alloys, and/or metal-doped plastic) such that the heat sink fins 302 may be implemented as a heat sink configured to dissipate heat from within the emissive display assembly 100 to air external to the emissive display assembly 100.

Referring now to FIG. 4, a side cross-sectional view of the emissive display assembly 100 of FIG. 2 is depicted. The emissive display assembly 100 of FIG. 2 may be implemented with components similar to, have an arrangement of components similar to, and function similarly to the emissive display assembly 100 as shown in and described with respect to FIG. 1, except that the support posts 110A are aligned with the additional support posts 114. Additionally, as shown in FIG. 2, the one or more electronic components 402 may be mounted on the circuit board 112.

Referring now to FIG. 5, a rear, partial see-through view of the emissive display assembly 100 of FIG. 2 is depicted. For example, FIG. 5 shows a back side of the emissive display element 104.

Referring now to FIG. 6, a rear, isometric view of a support plate 108 and support posts 110A of an exemplary embodiment according to the inventive concepts disclosed herein is depicted. The support plate 108 and the support posts 110A may be implemented in the emissive display assembly 100 as shown in and as described with respect to FIG. 2-5. The support plate 108 may be implemented similarly and function similarly to the support plate 108 as shown in and described with respect to FIGS. 1-5, except that the support plate 108 of FIG. 6 includes one or more (e.g., a plurality of) holes 602. The support posts 110A may be implemented similarly and function similarly to the at least one support structure as shown in and described with respect to FIGS. 1-5.

The holes 602 or counterbores may be have any suitable size (e.g., a diameter ¼ of a diameter of the support posts 110A, a diameter half of a diameter of the support posts 110A, a diameter equal to a diameter of the support posts 110A, a diameter twice a diameter of the support posts 110A, a diameter four times a diameter of the support posts 110A, etc.). Additionally, in some embodiments, the holes 602 may have the same or different sizes. There may be any suitable number of holes 602, such as a number of holes 602 less than a number of the support posts 110A, a number of holes 602 equal to a number of the support posts 110A, or a number of holes 602 greater than a number of the support posts 110A. The holes 602 may have any suitable shape (e.g., circular, elliptical, rectangular, triangular, pentagonal, hexagonal, etc.). The holes 602 may be implemented in any suitable uniform or non-uniform arrangement. For example, the holes 602 may be uniformly spaced such that the holes are centered among neighboring support posts 110A. For example, a non-uniform arrangement of the holes 602 may include at least one hole sized, shaped, and/or positioned to accommodate an electronic connection between the emissive display element 104 and the circuit board 112. Additionally, for example, the holes 602 may be positioned at any suitable locations on the support plate 108. In some embodiments, the holes 602 may be omitted.

The support posts 110A may be have any suitable height. The support posts 110A may have any suitable cross-sectional size. Additionally, in some embodiments, the support posts 110A may have the same or different cross-sectional sizes. There may be any suitable number of the support posts 110A. The support posts 110A may have any suitable cross-sectional shape (e.g., circular, non-circular, elliptical, rectangular, triangular, pentagonal, hexagonal, etc.). The support posts 110A may be implemented in any suitable uniform or non-uniform arrangement. For example, the support posts 110A may be uniformly spaced, such as in an array of columns and rows of the support posts 110A. Additionally, for example, the support posts 110A may be arranged in concentric rings or in a radial arrangement. For example, a non-uniform arrangement of the support posts 110A may include at least one support post sized, shaped, and/or positioned to accommodate one or more electronic components of the circuit board 112. Additionally, for example, the support posts 110A may be positioned at any suitable locations on the support plate 108. In some embodiments, one or more of the support posts 110A may be omitted, for example, to accommodate one or more electronic components of the circuit board 112.

Referring now to FIG. 7, a rear, isometric view of a support plate 108 and a support structure 1106 of an exemplary embodiment according to the inventive concepts disclosed herein is depicted. The support plate 108 and the support structure 1106 may be implemented in the emissive display assembly 100 as shown in and as described with respect to FIG. 2-5. The support plate 108 may be implemented similarly and function similarly to the support plate 108 as shown in and described with respect to FIGS. 1-5. The support structure 1106 may be implemented similarly and function similarly to the at least one support structure as shown in and described with respect to FIGS. 1-5.

For example, the support structure 1106 may comprise a plurality of support ridges (e.g., non-parallel support ridges or grooves), such as a ring-shaped (e.g., a rectangular-ring-shaped) support ridge and spoke support ridges extending radially outward and away from the ring-shaped center support ridge. In some embodiments, the plurality of support ridges (e.g., the ring-shaped support ridge and the spoke support ridges) may be interconnected (as shown in FIG. 7). In some embodiments, the plurality of support ridges may be less than fully connected; for example, the spoke support ridges may not be connected to the ring-shaped support ridge. In some embodiments, the support structure 1106 may comprise spoke support ridges extending radially outward and away from a center of the support plate 108, and the ring-shaped support ridge may be omitted. In some embodiments, the support structure 1106 may be symmetric; while in other embodiments, the support structure 1106 may be asymmetric. While FIG. 7 shows the support structure 1106 comprising the ring-shaped support ridge and the spoke support ridges extending radially outward and away from the ring-shaped center support ridge, it is contemplated that the support structure 1106 may be implemented as any suitable arrangement of parallel (e.g., as shown in FIG. 8) or non-parallel (e.g., as shown in FIG. 7) support ridges, where the support ridges have any suitable spacings, any suitable orientations with respect to other of the support ridges, any suitable shapes, any suitable lengths, any suitable heights, any suitable widths, or the like. Additionally, in some embodiments, one or more ridges of or a portion(s) of one or more ridges of the support structure 1106 may be omitted, for example, to accommodate electronic components of the circuit board 112.

Referring now to FIG. 8, a rear, isometric view of a support plate 108 and support ridges 110C of an exemplary embodiment according to the inventive concepts disclosed herein is depicted. The support plate 108 and the support ridges 110C may be implemented in the emissive display assembly 100 as shown in and as described with respect to FIG. 2-5. The support plate 108 may be implemented similarly and function similarly to the support plate 108 as shown in and described with respect to FIGS. 1-5. The support ridges 110C may be implemented similarly and function similarly to the at least one support structure as shown in and described with respect to FIGS. 1-5.

For example, the support ridges 110C may comprise a plurality of vertical, horizontal, or angled and parallel support ridges. The support ridges 110C may be implemented as heat sink fins. For example, the support ridges 110C may be vertical parallel support ridges configured to form naturally convective channels between neighboring support ridges 110C such that air can circulate within the cavity 118 so as to allow for convective cooling. While FIG. 8 shows the support ridges 110C comprising a plurality of vertical and parallel support ridges, it is contemplated that the support ridges 110C may be implemented as any suitable arrangement of parallel support ridges, where the support ridges have any suitable spacings, any suitable orientations, any suitable lengths, any suitable heights, any suitable widths, or the like. Additionally, in some embodiments, one or more of or a portion(s) of one or more of the support ridges 110C may be omitted, for example, to accommodate electronic components of the circuit board 112.

Figure 9:
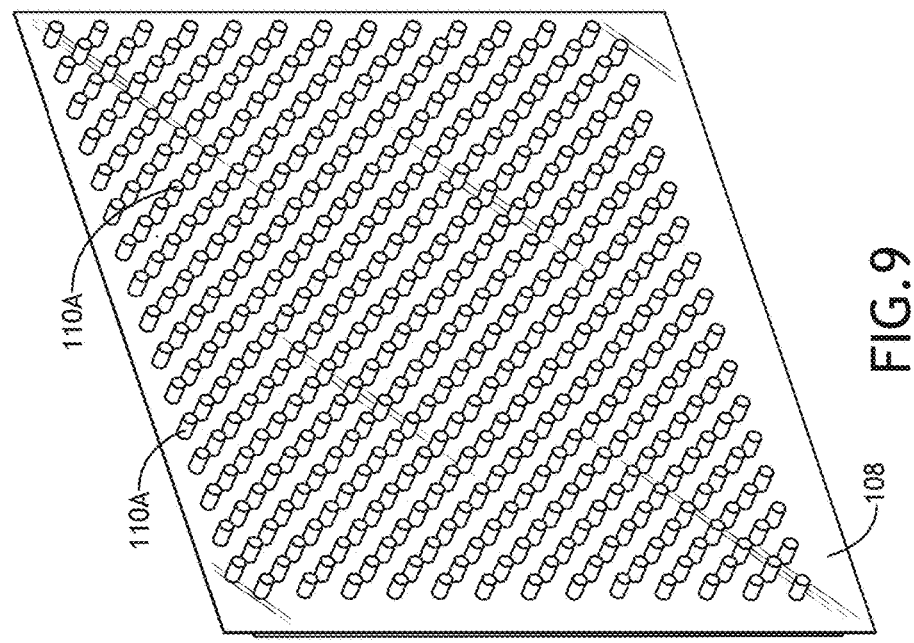
FIG. 9 is a rear, isometric view of a support plate and support posts of an exemplary embodiment according to the inventive concepts disclosed herein.

Referring now to FIG. 9, a rear, isometric view of a support plate 108 and support posts 110A of an exemplary embodiment according to the inventive concepts disclosed herein is depicted. The support plate 108 and the support posts 110A may be implemented in the emissive display assembly 100 as shown in and as described with respect to FIG. 2-5. The support plate 108 may be implemented similarly and function similarly to the support plate 108 as shown in and described with respect to FIGS. 1-5. The support posts 110A may be implemented similarly and function similarly to the at least one support structure as shown in and described with respect to FIGS. 1-5 and 6, except that the support posts 110A of FIG. 9 are more numerous, are more closely spaced, and have a shorter diameter.

Figure 10:
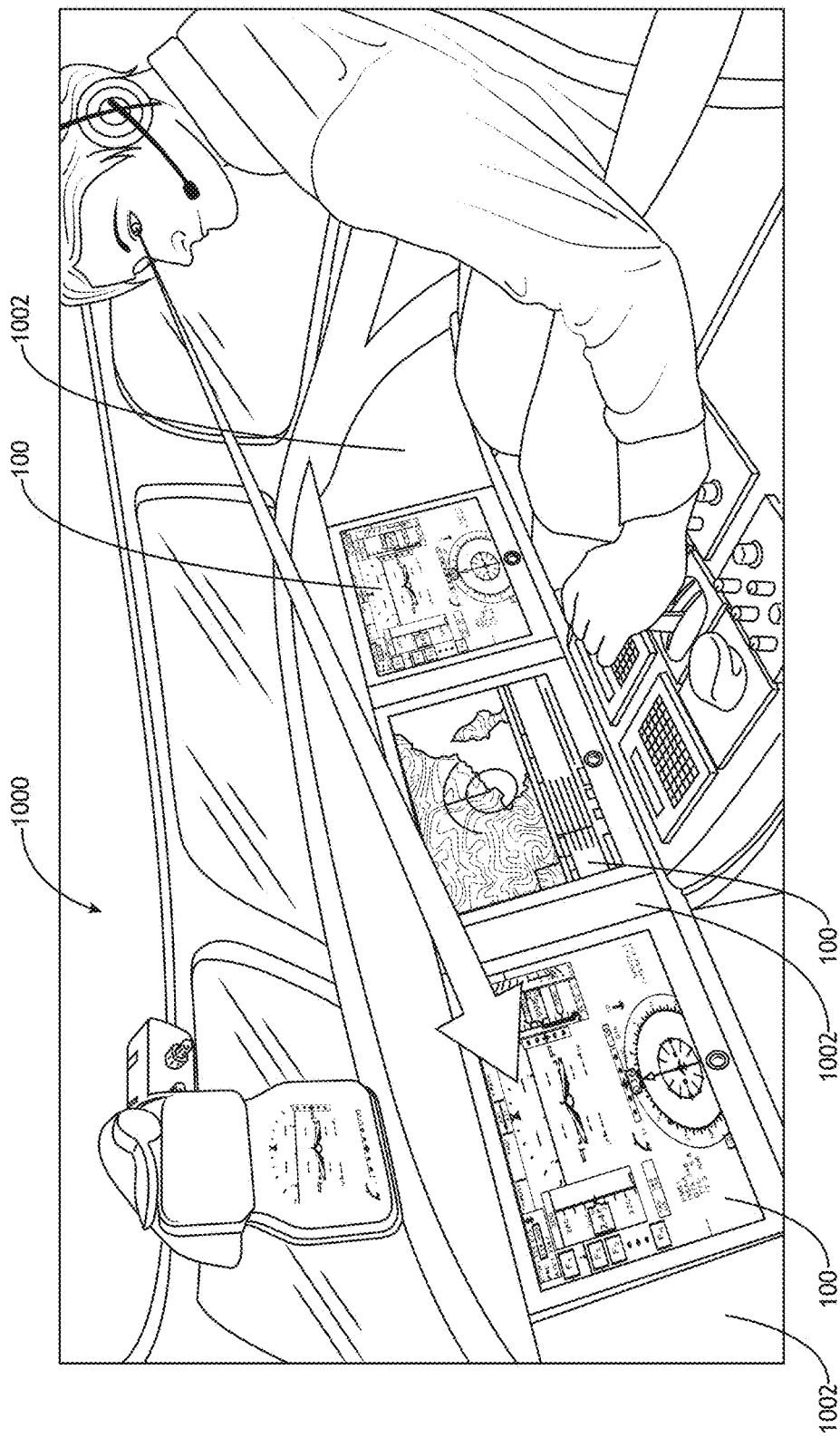
FIG. 10 is an isometric view of a plurality of emissive display assemblies implemented in a vehicle of an exemplary embodiment according to the inventive concepts disclosed herein.

Referring now to FIG. 10, an isometric view of a plurality of emissive display assemblies 100 implemented in a vehicle (e.g., an aircraft) of an exemplary embodiment according to the inventive concepts disclosed herein is depicted. As shown in FIG. 10, three emissive display assemblies 100 are implemented in a flight deck panel 1002, which is implemented in an aircraft's cockpit 1000.

As will be appreciated from the above, embodiments of the inventive concepts disclosed herein may be directed to a reinforced emissive display assembly and a system including a reinforced emissive display assembly.

As used throughout and as would be appreciated by those skilled in the art, "at least one non-transitory computer-readable medium" may refer to as at least one non-transitory computer-readable medium (e.g., at least one computer-readable medium implemented as hardware; e.g., at least one non-transitory processor-readable medium, at least one memory (e.g., at least one nonvolatile memory, at least one volatile memory, or a combination thereof; e.g., at least one random-access memory, at least one flash memory, at least one read-only memory (ROM) (e.g., at least one electrically erasable programmable read-only memory (EEPROM)), at least one on-processor memory (e.g., at least one on-processor cache, at least one on-processor buffer, at least one on-processor flash memory, at least one on-processor EEPROM, or a combination thereof), or a combination thereof), at least one storage device (e.g., at least one hard-disk drive, at least one tape drive, at least one solid-state drive, at least one flash drive, at least one readable and/or writable disk of at least one optical drive configured to read from and/or write to the at least one readable and/or writable disk, or a combination thereof), or a combination thereof).

As used throughout, "at least one" means one or a plurality of; for example, "at least one" may comprise one, two, three, . . . , one hundred, or more. Similarly, as used throughout, "one or more" means one or a plurality of; for example, "one or more" may comprise one, two, three, . . . , one hundred, or more. Further, as used throughout, "zero or more" means zero, one, or a plurality of; for example, "zero or more" may comprise zero, one, two, three, . . . , one hundred, or more.

In the present disclosure, the methods, operations, and/or functionality disclosed may be implemented as sets of instructions or software readable by a device. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the scope of the inventive concepts disclosed herein. The accompanying claims may present elements of the various steps in a sample order, and are not necessarily meant to be limited to the specific order or hierarchy presented.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. An emissive display assembly, comprising:
   an emissive display element having a back side and a front side;
   a circuit board associated with the emissive display element;
   a display chassis housing the emissive display element, the display chassis further housing the circuit board, the display chassis having an aperture such that the front side of the emissive display element is viewable through the aperture;
   a support plate held in place by the display chassis and positioned between the emissive display element and the circuit board, the support plate supporting the back side of the emissive display element such that, when a compressive force is applied to the front side of the emissive display element, the support plate restricts the emissive display element from bending more than a predetermined bending threshold;
   at least one support structure positioned between the support plate and the circuit board, the at least one support structure configured to reinforce the support plate such that at least part of the compressive force is transferred to the at least one support structure, wherein the at least one support structure abuts or is mechanically coupled to the support plate and abuts or is mechanically coupled to the circuit board;
   a rear cover mechanically coupled to a rear of the display chassis; and
   at least one additional support structure positioned between the rear cover and the circuit board, the at least one additional support structure configured to reinforce the support plate such that at least part of the compressive force is transferred through the at least one support structure and the at least one additional support structure to the rear cover.

2. The emissive display assembly of claim 1, wherein the at least one additional support structure abuts or is mechanically coupled to the circuit board and abuts or is mechanically coupled to the rear cover.

3. The emissive display assembly of claim 1, wherein the at least one additional support structure comprises a plurality of posts.

4. The emissive display assembly of claim 1, wherein at least one cavity is formed between the rear cover and the support plate, wherein the support plate and the at least one support structure are thermally conductive, wherein the at least one support structure forms a convective heat sink field within the cavity.

5. The emissive display assembly of claim 1, wherein the at least one additional support structure is aligned with the at least one support structure.

6. The emissive display assembly of claim 1, wherein at least some of the at least one additional support structure is unaligned with the at least one support structure.

7. The emissive display assembly of claim 1, wherein the rear cover comprises a data port communicatively coupled to the circuit board.

8. The emissive display assembly of claim 1, wherein the rear cover comprises a plurality of heat sink fins on an external side of the rear cover.

9. The emissive display assembly of claim 1, wherein the at least one support structure comprises a plurality of support posts.

10. The emissive display assembly of claim 1, wherein the at least one support structure comprises a plurality of non-parallel support ridges.

11. The emissive display assembly of claim 1, wherein the at least one support structure comprises a plurality of parallel support ridges.

12. The emissive display assembly of claim 1, wherein the plurality of parallel support ridges are implemented as heat sink fins.

13. The emissive display assembly of claim 1, wherein a cavity is formed between the circuit board and the support plate, wherein the support plate and the at least one support structure are thermally conductive, wherein the at least one support structure forms a convective heat sink field within the cavity.

14. The emissive display assembly of claim 1, wherein support plate comprises at least one hole.

15. The emissive display assembly of claim 1, wherein the emissive display element is an organic light-emitting diode (OLED) display element, a micro light-emitting diode (mLED) display element, or a quantum-dot light emitting-diode (QLED) display element.

16. A system, comprising:
   a vehicle; and
   an emissive display assembly implemented in the vehicle, the emissive display assembly comprising:
      an emissive display element having a back side and a front side;
      a circuit board associated with the emissive display element;
      a display chassis housing the emissive display element, the display chassis further housing the circuit board, the display chassis having an aperture such that the front side of the emissive display element is viewable through the aperture; and
      a support plate held in place by the display chassis and positioned between the emissive display element and the circuit board, the support plate supporting the back side of the emissive display element such that, when a compressive force is applied to the front side of the emissive display element, the support plate restricts the emissive display element from bending more than a predetermined bending threshold, at least one support structure positioned between the support plate and the circuit board, the at least one support structure configured to reinforce the support plate such that at least part of the compressive force is transferred to the at least one support structure, wherein the at least one support structure comprises a plurality of non-parallel support ridges.

17. An aircraft system, comprising:
a flight deck panel implemented in a cockpit of an aircraft; and
an emissive display assembly implemented in the flight deck panel, the emissive display assembly comprising:
   an emissive display element having a back side and a front side;
   a circuit board associated with the emissive display element;
   a display chassis housing the emissive display element, the display chassis further housing the circuit board, the display chassis having an aperture such that the front side of the emissive display element is viewable through the aperture; and
   a support plate held in place by the display chassis and positioned between the emissive display element and the circuit board, the support plate supporting the back side of the emissive display element such that, when a compressive force is applied to the front side of the emissive display element, the support plate restricts the emissive display element from bending more than a predetermined bending threshold;
   at least one support structure positioned between the support plate and the circuit board, the at least one support structure configured to reinforce the support plate such that at least part of the compressive force is transferred to the at least one support structure, wherein the at least one support structure abuts or is mechanically coupled to the support plate and abuts or is mechanically coupled to the circuit board;
   a rear cover mechanically coupled to a rear of the display chassis; and
   at least one additional support structure positioned between the rear cover and the circuit board, the at least one additional support structure configured to reinforce the support plate such that at least part of the compressive force is transferred through the at least one support structure and the at least one additional support structure to the rear cover.

* * * * *